US012581605B2

(12) United States Patent
Ten-Jet-Foei

(10) Patent No.: US 12,581,605 B2
(45) Date of Patent: Mar. 17, 2026

(54) VEHICLE AND A FOLDABLE DISPLAY DEVICE FOR USE THEREIN

(71) Applicant: INALFA ROOF SYSTEMS GROUP B.V., Oostrum (NL)

(72) Inventor: Suyanto Teri Wahiyu Ten-Jet-Foei, Helmond (NL)

(73) Assignee: INALFA ROOF SYSTEMS GROUP B.V., Oostrum (NL)

( * ) Notice: Subject to any disclaimer, the term of this patent is extended or adjusted under 35 U.S.C. 154(b) by 218 days.

(21) Appl. No.: 18/582,208

(22) Filed: Feb. 20, 2024

(65) Prior Publication Data

US 2024/0292552 A1     Aug. 29, 2024

(30) Foreign Application Priority Data

Feb. 23, 2023    (EP) ..................................... 23158089

(51) Int. Cl.
B60K 35/00          (2024.01)
B60K 35/22          (2024.01)
(Continued)

(52) U.S. Cl.
CPC ........... H05K 5/0217 (2013.01); B60K 35/22 (2024.01); B60K 35/53 (2024.01); *B60K 2360/771* (2024.01)

(58) Field of Classification Search
CPC ...... H05K 5/0217; B60K 35/22; B60K 35/53; B60K 2360/771; B60R 2011/0028;
(Continued)

(56) References Cited

U.S. PATENT DOCUMENTS 11,460,978 B2 * 10/2022 Nakanishi ............. G06F 3/0485
11,673,513 B2 * 6/2023 Lojko ................. B60R 11/0235
                                                              348/837
(Continued)

FOREIGN PATENT DOCUMENTS

CN        108773329 A     11/2018
EP          2873563 A1     5/2015
(Continued)

OTHER PUBLICATIONS

Search Report in corresponding European patent application serial No. 23158089.5 dated Sep. 5, 2023.

*Primary Examiner* — Howard D Brown, Jr.
(74) *Attorney, Agent, or Firm* — Westman, Champlin & Kochler, P.A.

(57)                ABSTRACT
A display device attachable to a vehicle roof construction, comprises: at least one foldable display having first and a second display parts, a first drive system mounted to the roof construction for moving the display into a substantially horizontal orientated stored folded position, and into an operational unfolded position. In their operational position, the first display part is above the second display part, seen in a vertical direction and such that a flexible display part connects the first and second display parts. The display part can show a part of an image and connects the first and second display parts such that a visually uninterrupted image across the whole image producing side of the display may be observed by the occupants. The first drive system comprises an electric motor, a gear device driven by the electric motor and being capable of rotatably driving the first and second display part.

20 Claims, 12 Drawing Sheets

(51) Int. Cl.
    *B60K 35/53*       (2024.01)
    *H05K 5/02*       (2006.01)

(58) Field of Classification Search
    CPC ..... B60R 2011/0082; B60R 2011/0092; B60R
                     11/0235; B60R 11/0229; B60R
                   2011/0085; G09F 21/049; G09F 9/301
    See application file for complete search history.

(56)                 References Cited

U.S. PATENT DOCUMENTS

| | | | |
|---|---|---|---|
| 2012/0140126 A1* | 6/2012 | Werth | B60R 11/0264 |
| | | | 296/210 |
| 2015/0138043 A1 | 5/2015 | Rawlinson et al. | |
| 2017/0158034 A1 | 6/2017 | Nellen et al. | |
| 2020/0070736 A1 | 3/2020 | Kim | |
| 2021/0061100 A1* | 3/2021 | Zhou | B60K 35/53 |
| 2021/0129635 A1 | 5/2021 | Park et al. | |
| 2021/0178899 A1* | 6/2021 | Hélot | B60K 35/50 |
| 2021/0197731 A1 | 7/2021 | Vervoort et al. | |
| 2021/0212221 A1 | 7/2021 | Diboine et al. | |
| 2021/0212225 A1 | 7/2021 | Song et al. | |
| 2021/0371325 A1* | 12/2021 | Black | C03C 4/18 |
| 2022/0176889 A1* | 6/2022 | Lu | B60R 13/0212 |
| 2024/0292552 A1* | 8/2024 | Ten-Jet-Foei | G09F 21/049 |

FOREIGN PATENT DOCUMENTS

| | | |
|---|---|---|
| KR | 20190140806 A | 12/2019 |
| WO | 2020020763 A1 | 1/2020 |

* cited by examiner

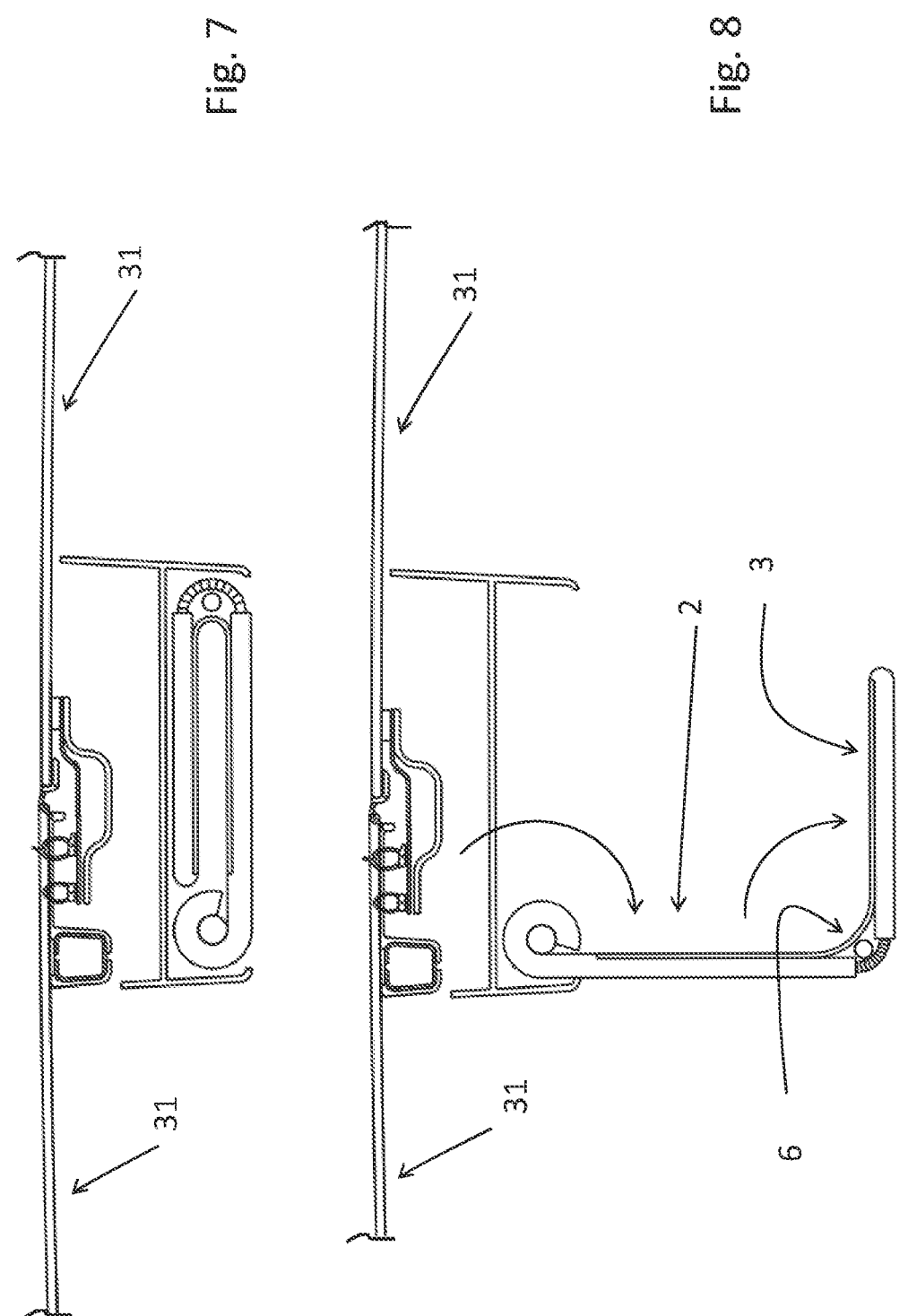

VEHICLE AND A FOLDABLE DISPLAY DEVICE FOR USE THEREIN

CROSS-REFERENCE TO RELATED APPLICATION

The present application is based on and claims the benefit of European patent application Serial No. 23158089.5, filed Feb. 23, 2023, the content of which is hereby incorporated by reference in its entirety.

BACKGROUND

The discussion below is merely provided for general background information and is not intended to be used as an aid in determining the scope of the claimed subject matter.

Aspects of the invention relate to a foldable display device for a vehicle.

Display devices in vehicles are known from the prior art for instance in which display devices are attached to an interior side of the roof of a vehicle and which displays can easily be pivoted from a stored position into an operational position in which the display screen is readable to the occupants of the vehicle.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in deter-mining the scope of the claimed subject matter. The claimed subject matter is not limited to implementations that solve any or all disadvantages noted in the Background.

One broad aspect of the present invention is to provide a display device which is stored in a folded condition to save space and to protect its flexible display layer from being damaged.

In one embodiment, a vehicle may be provided with the display device attachable to a roof construction of the vehicle. The display device comprises at least one foldable display capable of showing images to occupants in the vehicle. The foldable display has a first and a second display part. A first drive system is mounted to the roof construction and is configured to move the foldable display at least into a substantial horizontal orientated stored position, in which the foldable display is folded, and into an operational position in which the foldable display is in an unfolded position such that an image producing side of the foldable display is visible for occupants in an interior space of the vehicle. The first and second display parts, in their opera-tional position, are positioned such that the first display part is above the second display part, seen in a vertical direction, and such that a flexible display layer connects the first and second display parts. Said flexible display layer is capable of showing a part of an image and connecting the first and second display parts in such a way that a visually uninter-rupted image across the whole image producing side of the foldable display is observed by the occupants. The first drive system comprises at least one electric motor, and a gear device driven by the at least one electric motor and capable of rotatably driving the first display part and rotatably driving the second display part. Such drive system is capable of realizing a folding and unfolding movement of the foldable display. This is achieved by driving two axes with at least one electric motor and whereby each of the display parts is equipped with an axis which axis is rotatable and as such each display part is capable of rotating around each of the axes. For instance, it is conceivable that the rotation of the first and second axis is done in series or sequence, one axis movement after to the other, or it is conceivable to drive the rotation of the first and second axis in parallel or simultaneously.

Also, it is conceivable that instead of having one motor driving the two axes, two motors at each opposite end of one of the axes operates the foldable display.

In another embodiment of the present invention, the roof construction is either a part of the roof of the integral body of the vehicle or a roof construction having at least one semi-transparent panel. The display device may be attached to a part of the body, for instance if the vehicle is equipped with a fixed steel roof body. However, it is also conceivable that the display device is equipped with an open roof construction comprising a movable semi-transparent panel, or a fixed roof construction comprising a fixed semi-trans-parent panel. In each of the cases a pocket is created on the interior side of the roof construction for the display device in which the display is stored in its inactive position or stored position. In such stored position, the foldable display is folded with its image producing side or flexible display layer inwardly such that it cannot be damaged by goods transported in the interior of the vehicle or accidental damages by occupants.

In one embodiment of the invention the gear device is capable of rotatably driving the first display part and the second display part in sequential movements, whereby in a first rotation the first and second display parts are rotatably driven together through an angle of substantially 90 degrees and subsequently in a second rotation, and wherein the second display part is being rotated through an angle of substantially 180 degrees.

It is however conceivable that in another embodiment of the invention the gear device is capable of rotatably driving the first display part and the second display part at least partly at the same time. The unfolding sequence of the first and second display parts may be subjected to the available space in which the display parts need to be unfolded. This means that the space available for unfolding is determined by the fact that the occupants in the rear seats must not be hindered by the unfolding display parts. For instance, with limited space it is conceivable that first the first display part is rotated through 90 degrees and afterwards the second display part. In this way a minimum of space is required for unfolding the display parts. However, in case there is enough space for unfolding the display parts, a combined rotation of the first and second display parts is conceivable. Such combined rotation may be conceivable by first rotating the first and second display parts together through a certain angle, for instance 30 degrees. At such an angle simultane-ously the second display part rotates with the first display part whereby the combined rotation ends when the first and second display parts form a flat surface. In such a combined rotation the time for completely unfolding of the first and second display parts may be shorter than is the case in a subsequent unfolding sequence.

In one aspect of the present invention, the foldable display is further reinforced with pairs of first and second reinforce-ment brackets attached to respectively both lateral edges of the first and second display parts and a first rotation axis is rotatably connected via a rotation shaft to the first display part and wherein the first rotation axis is fixedly connected to the first reinforcement brackets and wherein a second rotation axis is connected to the second display part by the second reinforcement brackets. To be able to rotate each of the first and second display parts by the respective first and second rotation axis, the rotational forces of the respective axis are transferred to the display parts via the first and second reinforcement brackets. In this way the rotational drive forces are spread over the lateral side edges of the respective display parts. The first and second rotation axis are fixedly connected to the respective first and second reinforcement brackets such that the rotational forces of the axis are transferred to the first and second display parts.

In a further aspect of the invention, the first rotation axis is rotatably connected at opposite ends to the roof construction by a pair of upper axis brackets. The upper axis brackets support the first rotation axis and part of the weight of the first drive system and the weight of the rest of the foldable display unit, towards the roof construction.

In another aspect of the invention, the gear device comprises at least a first in-coupling gearwheel connected to an out-coupling axis of the at least one electric motor and an intermediate gear unit selectively coupled between the first in-coupling gearwheel and a first out-coupling gearwheel connected to the first rotation axis and a second out-coupling gearwheel connected to a tooth belt wheel, the latter which is capable of rotating freely around the first rotation axis. The first rotation axis may be driven directly by the first outcoupling gearwheel, but due to the second rotation axis being remote from the first rotation axis, the second rotation axis needs to be driven by the second out-coupling gearwheel and the tooth belt connected therewith.

In yet another aspect of the invention, the gear device further comprises a tooth belt being driven by the tooth belt wheel and the tooth belt being connected, opposite to the tooth belt wheel, to a second outcoupling tooth belt wheel, the latter being connected to the second rotation axis.

A pair of intermediate gears coupled between the in-coupling gearwheel and a first out-coupling gearwheel connected to the first rotation axis and a second out-coupling gearwheel connected to the tooth belt. In such case that the display parts of the foldable display are rotated from the stored position to an operative position (or vice-versa) in a sequence of rotational movements whereby the first display part, in a first phase, rotates downwardly and in a second phase the second display part rotates downwardly, the torque of the at least one electric motor is lead via the first outcoupling gearwheel, via an intermediate gear unit firstly to the first-outcoupling gearwheel. And when the first display part is rotated through 90 degrees, the torque is lead to the second out-coupling gearwheel which is connected to the tooth belt for rotation of the second display part.

It may also be conceivable in another embodiment that the foldable display needs to be rotated from its stored position to an operative position whereby the first display part and the second display part are rotatably driven in parallel. This may be done by unfolding of the display device such that the extreme parts of the unfolding display parts do not interfere with occupants in the vehicle or parts of in the interior of the vehicle. In a first stage the first display part is rotatably driven towards a certain angle, at which angle the second display starts to be rotatably driven in parallel.

In yet another embodiment a second drive system is connected to the foldable display for moving the foldable display screen in a substantially horizontally oriented longitudinal direction. To be able to offer a correct position of the foldable display device for the occupants to view the image producing side of the display (the flexible display layer) in the operative position, it may be required to move the display device further away from the occupants or closer to the occupants.

In a further aspect of this embodiment the second drive system comprises a pair of guides connected to the roof construction of the vehicle in a longitudinal direction, a pair of slider brackets connected to the foldable display, each of the slider brackets being slidably connected in each of the guides, a pair of drive cables slidably guided in each of a channel in the respective guides, whereby the drive cables are connected to each of the slider brackets and the drive cables are driven by a second electric motor and wherein each of the slider brackets are capable of being moved in longitudinal direction along the guide. The display device maybe moved in a longitudinal direction under influence of an electric motor placed or attached for instance in the rear part of the roof construction. The motor may be electronically controlled such that the display device may be moved in longitudinal direction back and forth to a preferred position by the occupant. It is also conceivable that when the display device is unfolded towards its operative position, the second drive system by means of an electronic control, may be used to move the display device in a longitudinal direction in parallel to the unfolding movements of the display parts such that the display parts do not touch any objects/occupants present in the interior of the vehicle.

According to another aspect of the invention the foldable display device, is capable of being moved in its stored position, whereby the foldable display in the forementioned stored position is supported by at least one support. The weight of the foldable display in an operative position is taken up largely by the roof construction via both the upper axis brackets. However, in a stored position the foldable display may need an additional support due to the dynamic influences of the vibrating vehicle upon the foldable display. The foldable display may be supported additionally by a pair of supports supporting a side of the folded display parts, remote from the upper axis bracket. The second drive system may be used to move the display device into a position whereby the pair of supports physically take up a part of the weight of the display device, such that rattle against the roof construction is avoided.

BRIEF DESCRIPTION OF THE DRAWINGS

Aspects of the invention will be further explained with reference to the drawings showing exemplary embodiments of the display device, the roof construction and a vehicle.

FIG. 7 is a side view of the vehicle roof and of the display device in a folded and stored position.

FIG. 8 is a side view corresponding to that of FIG. 7 but showing the display device in a position whereby the display device is halfway with unfolding towards an unfolded position.

DETAILED DESCRIPTION OF ILLUSTRATIVE EMBODIMENTS

Figure 1:
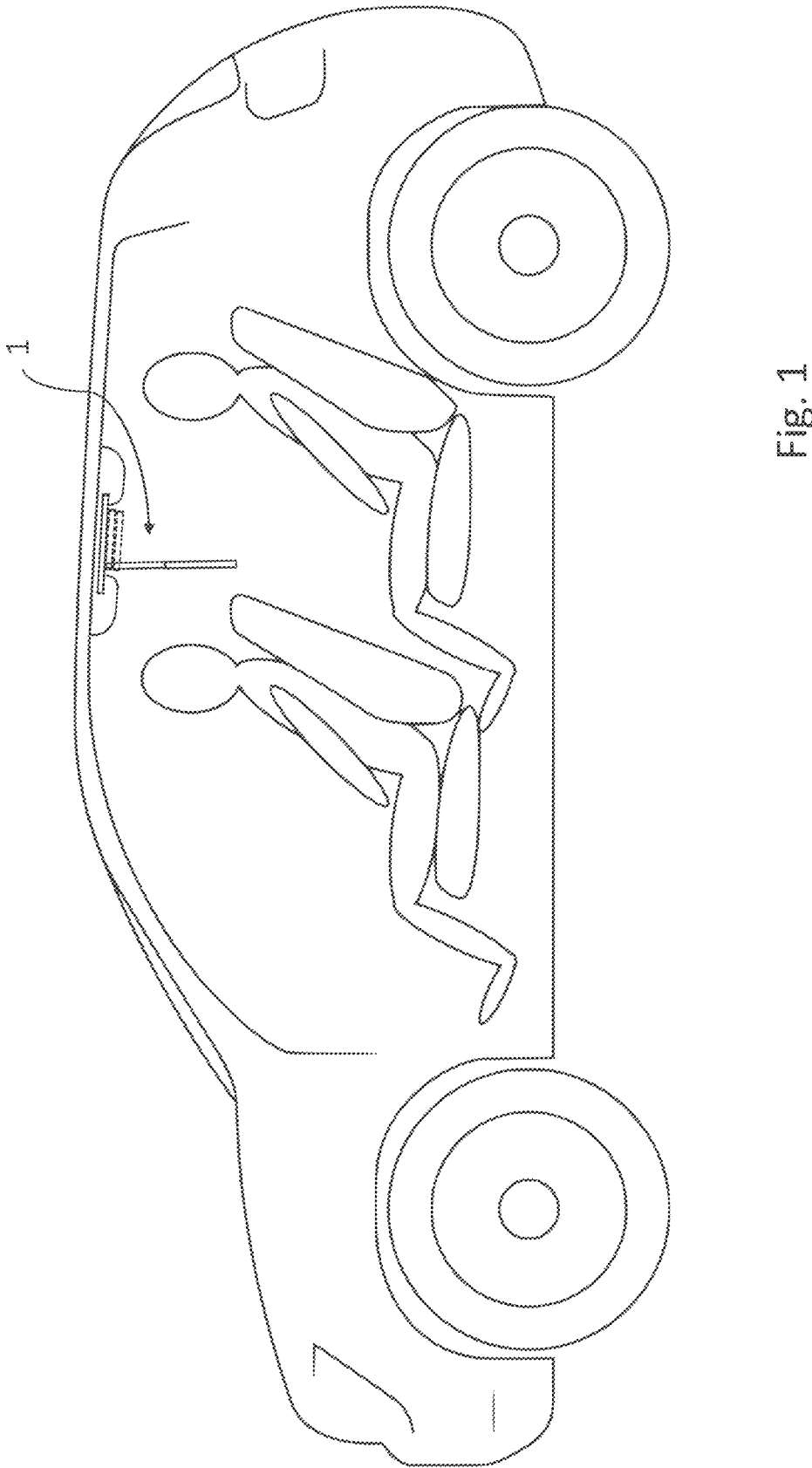
FIG. 1 is a schematic side view of the vehicle and the display device.

FIG. 1 illustrates a vehicle, in this case a passenger car comprising front and rear seats for vehicle occupants and a display device. The display device is capable of being folded (here shown in dotted lines) or being unfolded (solid lines) into an operational position to produce a display, in such a way that a visually uninterrupted image across the whole of the image producing side of the foldable display device may be observed by the occupants in this case the occupants in the rear seat. The operational position of the foldable display 1 is the position in which the rear occupant has the optimum line of view on the foldable display seen in a vertical plane. It is conceivable that the foldable display 1 is available for one or both occupants in the front of the vehicle. In the stored position, the foldable display 1 is positioned substantially adjacent and parallel to the roof. The roof construction to which the foldable display 1 is mounted is either of a part of the roof 30 of the integral body of the vehicle and a roof construction having at least one semi-transparent panel 31.

Figure 2:
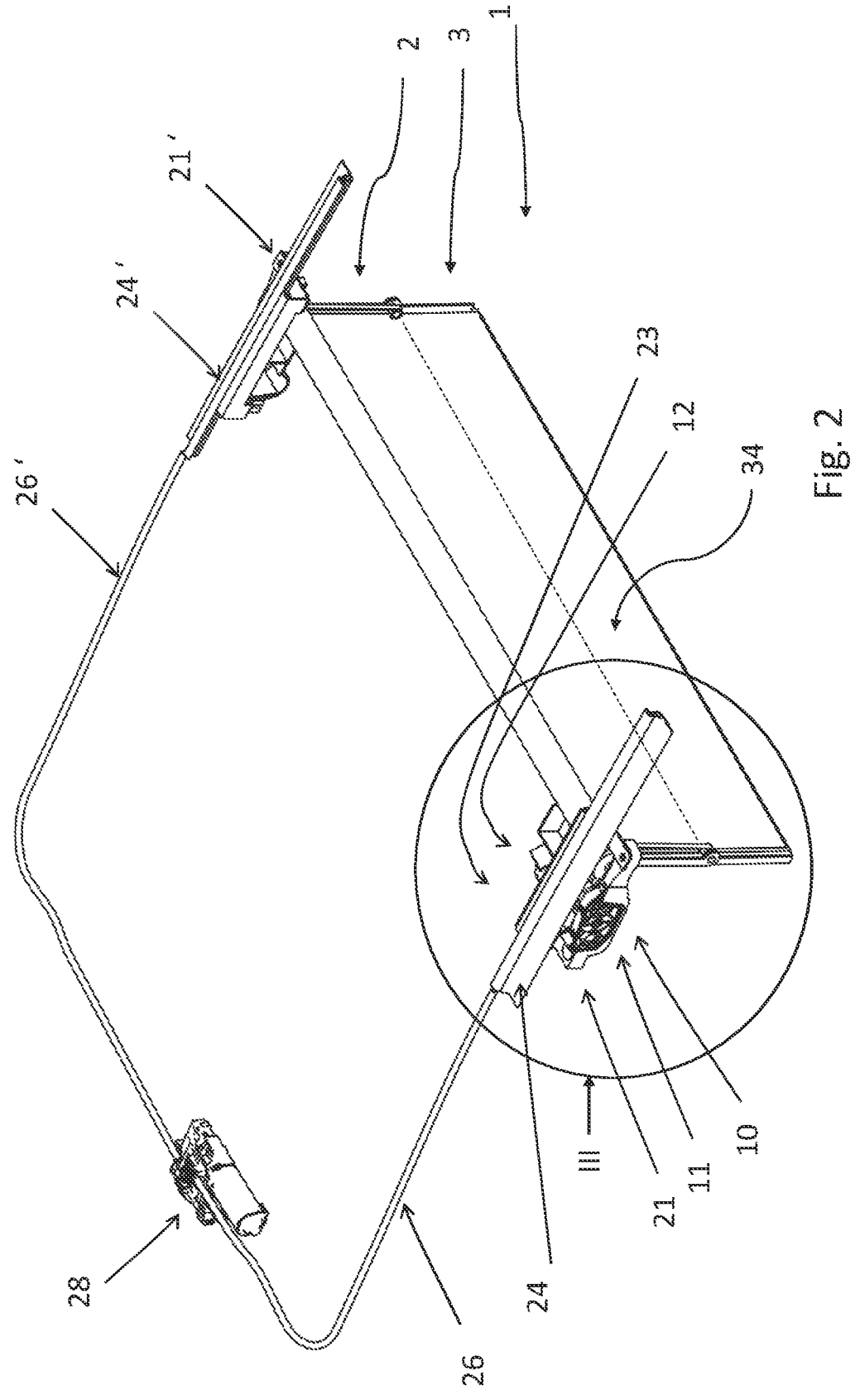
FIG. 2 is an isometric view of the display device.

FIG. 2 shows the foldable display 1, having a first display part 2 and a second display part 3, separated by a dotted line. In fact, a flexible display layer 6 connects the first and second display parts 2, 3 and enables a continuous display screen in the unfolded position of the foldable display 1. The unfolding and folding process of the foldable display 1 is driven by a first drive system 10. This drive system 10 comprises further several parts such as a gear device 12 with which the first and second display parts 2, 3 are rotated to the unfolded position and backwards to the stored position. In this embodiment shown in FIG. 2, the first drive system 10 is positioned only at one lateral side of the display device. It is also conceivable that the first drive system 10, 10' is fitted at both lateral sides of the display device as will be further explained describing FIG. 13.

In FIG. 2 further a second drive system 23 is shown for moving the complete foldable display 1 in a longitudinal direction. This can be required to adjust the distance of the foldable screen device 1 in an unfolded position with regards to the passengers. However, it is also conceivable that the second drive system 23 is used in an embodiment whereby the foldable display 1 is being moved in a longitudinal direction to engage the folded first and second display parts 2, 3 with a support 29 as further described for FIG. 12.

Figures 3A, 3B:
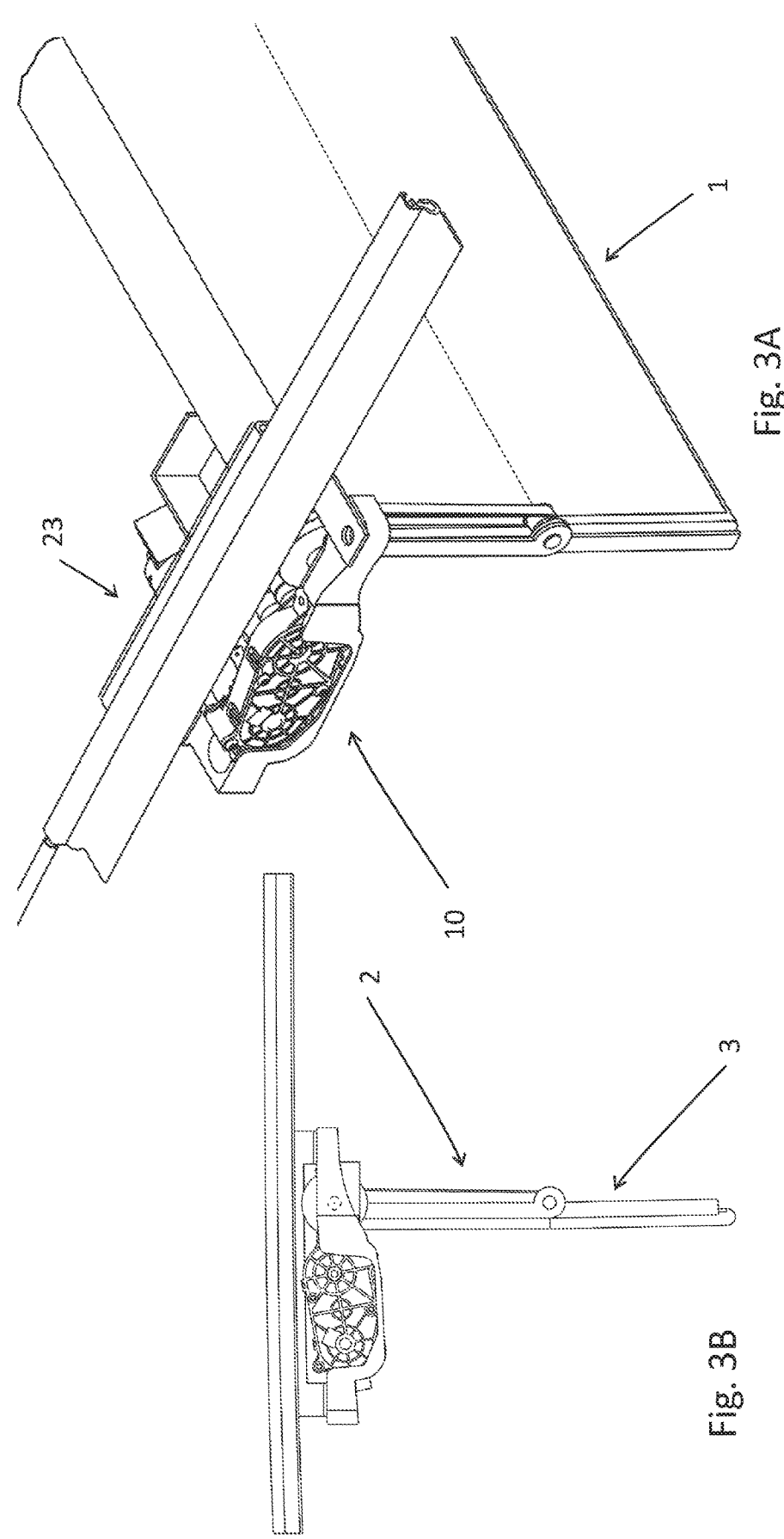
FIG. 3A is a detailed view taken of the part III of FIG. 2.
FIG. 3B is a true side view of FIG. 3A.

In FIGS. 3A and B the first drive system 10, 10' is shown in more detail.

Figure 4:
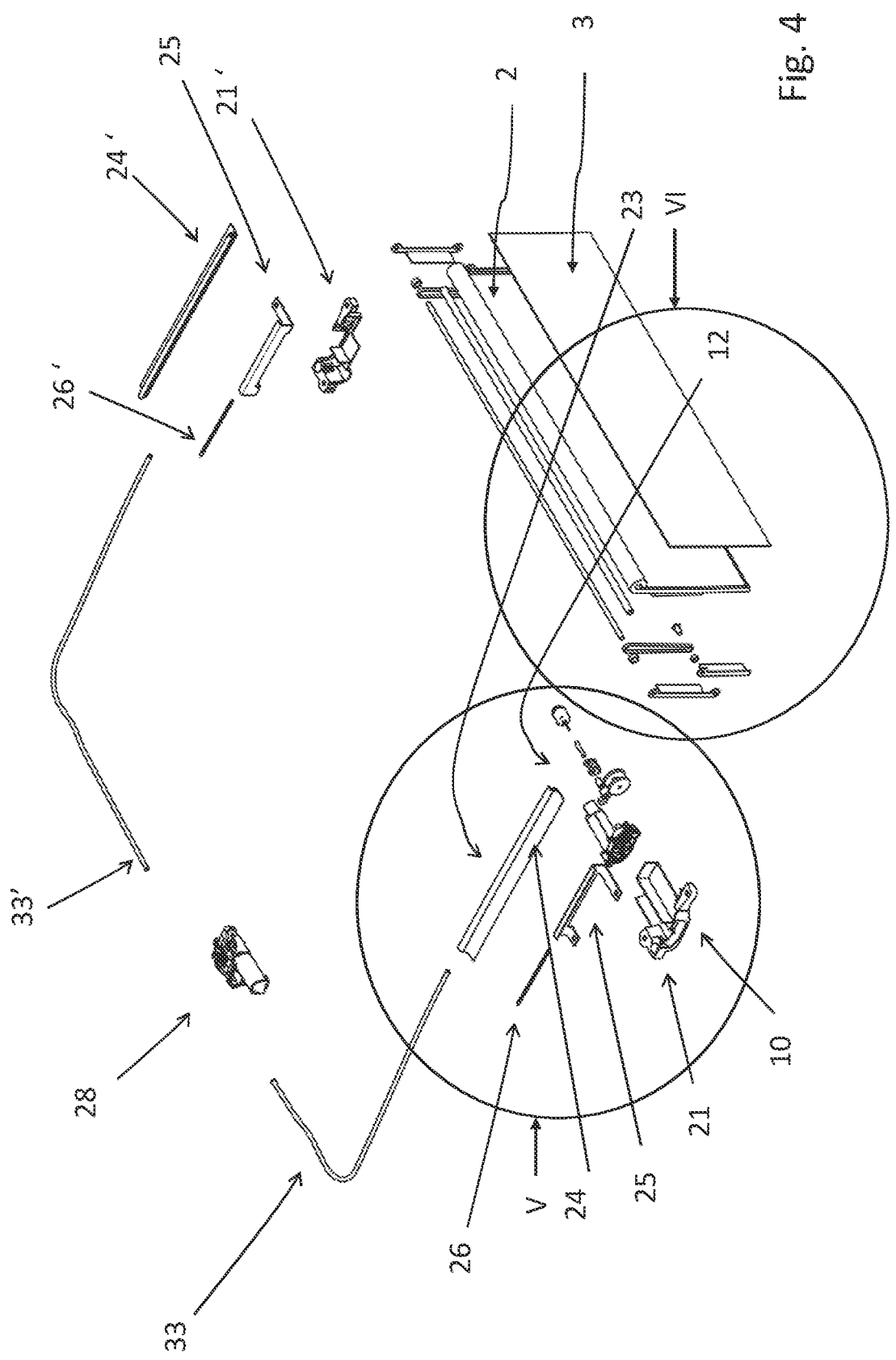
FIG. 4 is an isometric exploded view of the display device.

In FIG. 4 the complete foldable display device is shown in an exploded view. The circles V and VI focusses on the first drive system 10, although in circle V also some parts of the second drive system 23 is shown.

Figure 5:
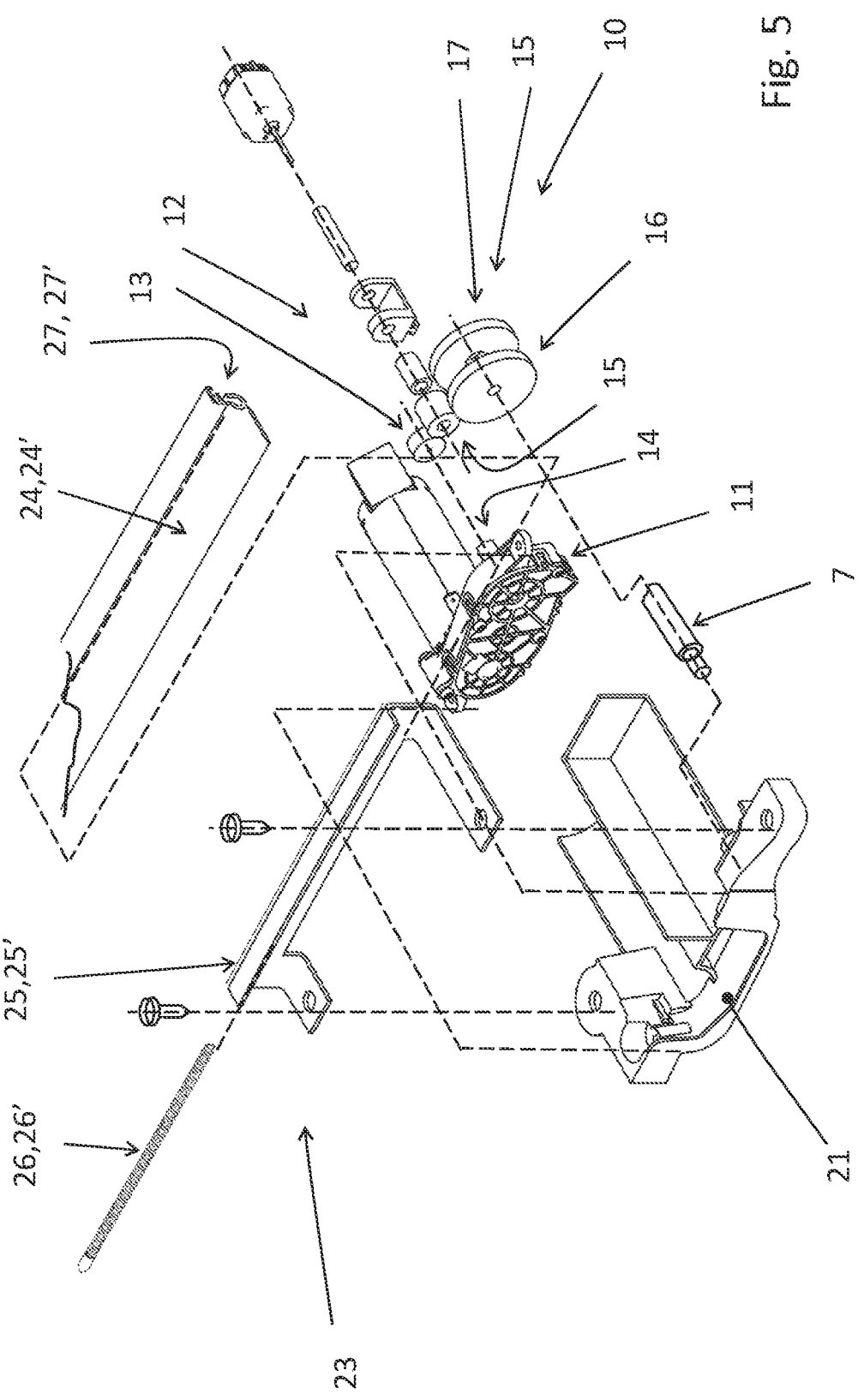
FIG. 5 is a detailed view of part V in FIG. 4.

FIG. 5 discloses the circle V of FIG. 4 in more detail. The heart of the first drive system 10 is the first electric motor 11. This motor has an L-shape and an out-coupling axis 14. Connected on this out-coupling axis 14 is a first in-coupling gearwheel 13. This in-coupling gearwheel 13 is connected to the intermediate gear unit 15. This intermediate gear unit 15 in turn is selectively connected to the first and/or second out-coupling gearwheel 16, 17. This means that the intermediate gear unit 15 is capable of selectively connecting the first in-coupling gearwheel 13 to the first out-coupling gearwheel 16 and/or the first in-coupling gearwheel 13 to the second-outcoupling gearwheel 17 in a manner known in the art. The electric motor 11 is mounted in an upper axis bracket 21, 21' by means of screws or the like. And the intermediate gear unit 15 is also mounted in the upper axis bracket 21, 21'. The gear device 12 described before thus comprises the first in-coupling gear wheel 13, out-coupling axis 14, intermediate gear unit 15, first out-coupling gear wheel 16, second outcoupling gear wheel 17, first tooth belt wheel 18, tooth belt 19, second tooth belt wheel 20. The first rotation axis 7 is also mounted in the upper axis bracket 21, 21'. In this embodiment there is another upper axis bracket 21' at the opposite short side of the first rotation axis 7, such that the first rotation axis 7 which carries the first and second display parts 2, 3 is borne by the opposite upper axis brackets 21, 21'. The first out-coupling gearwheel 16 is connected to a first rotation axis 7 (shown in FIGS. 5 and 6), the second out-coupling wheel 17 being connected to a tooth belt wheel 18 and both are rotatably connected to the first rotation axis 7.

Figure 6:
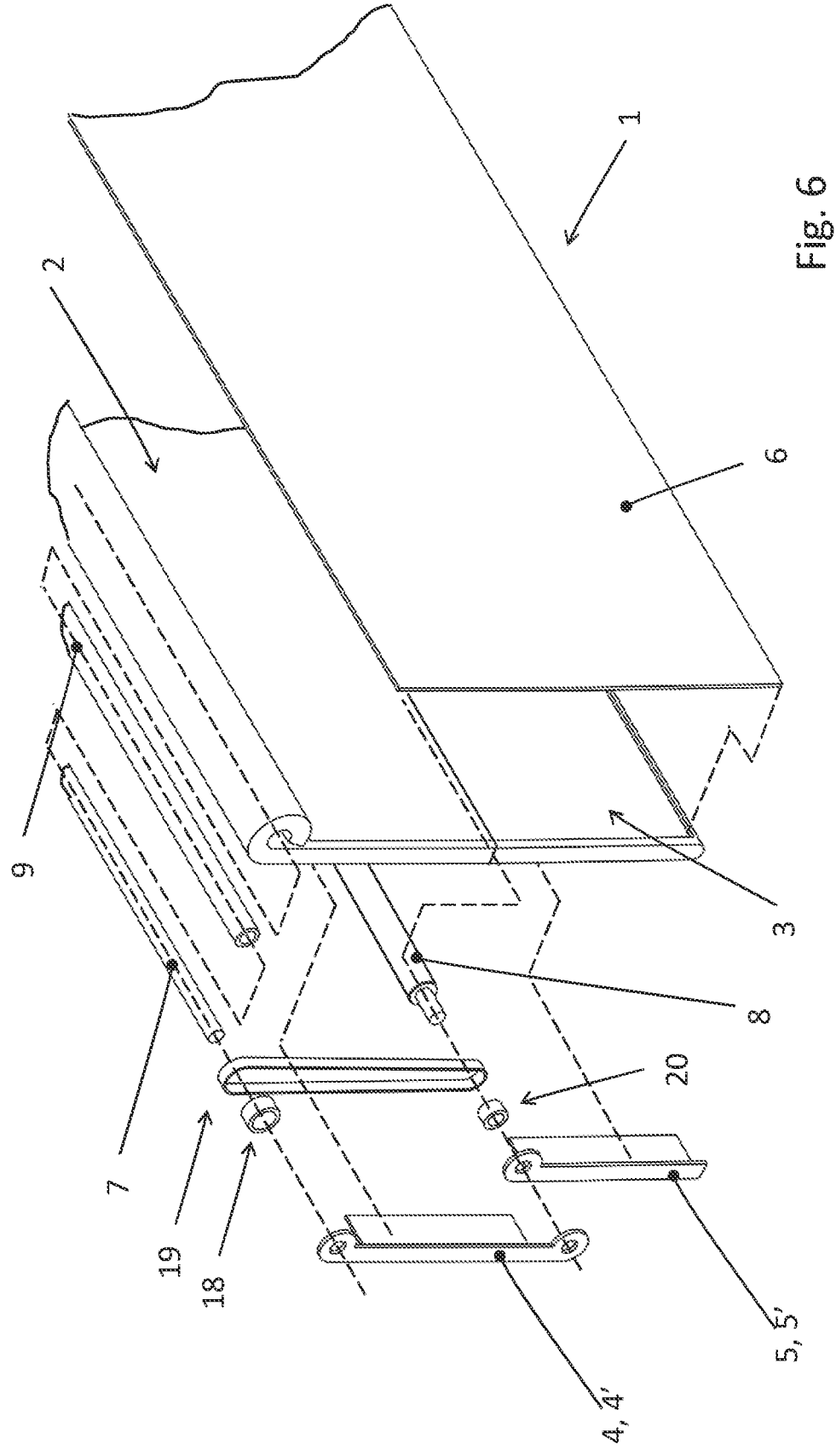
FIG. 6 is a detailed view of part VI in FIG. 4.

FIG. 6 discloses the circle VI of FIG. 4 on a larger scale and in more detail. The forementioned first rotation axis 7 is shown in FIG. 6. Further shown are the tooth belt wheel 18 which may rotate freely around the first rotation axis 7 and the tooth belt 19 which is connected to the tooth belt wheel 18 and on an opposite side of the tooth belt 19 being connected to a second tooth belt wheel 20. Second tooth belt 20 is fixedly connected to a second rotation axis 8. First rotation axis 7 is rotatably held in a rotation shaft 9. This rotation shaft 9 is connected to an upper end of the first display part 2.

Figure 9:
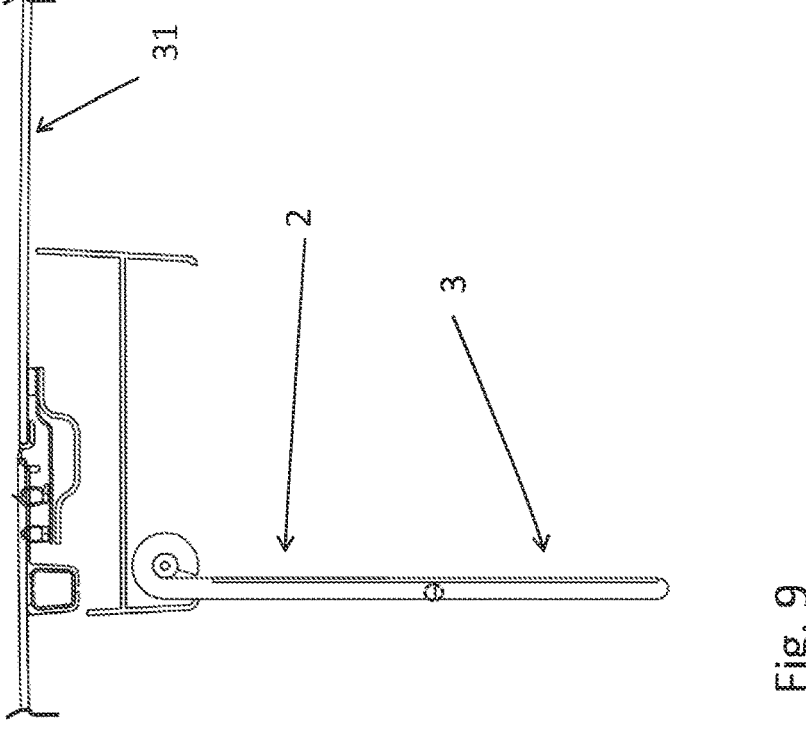
FIG. 9 is a side view corresponding to that of FIG. 7 but showing the display device in an unfolded position.

A pair of first reinforcement brackets 4, 4' is connected to both of left and right lateral edges of the first display part 2. The reinforcement brackets 4, 4' are also fixedly connected to the first rotation axis 7. Likewise, a pair of second reinforcement brackets 5, 5' is connected to both of left and right lateral edges of the second display part 3, here also the pair of brackets 5, 5' are fixedly connected to the second rotation axis 8. Seen from a folded position of the foldable display device in its stored position (FIG. 7), the rotation of the first and second display parts 2,3 follows from a rotation of the electric motor 11, which rotates the first in-coupling gear wheel 13, said wheel rotates the intermediate gear unit 15, whereby this unit 15 creates a connection between the gearwheel 13 and the first out-coupling gear wheel 16. Upon rotation of this gear wheel 16, which is fixedly connected to the first rotation axis 7, axis 7 will rotate and thus rotate the pair of reinforcement brackets 4, 4' whereby due to the connection of these brackets 4, 4' to the lateral edges of the first display part 2, the display part 2 will be rotated. The second display part 3 which is folded on top of the first display part 2 is able to rotate with the movement of display part 2. The rotational movement of these first and second display parts 2,3 (in this embodiment shown in FIGS. 7, 8, 9) continues through substantially 90 degrees (FIG. 8). To be able to rotate the second display part 3, the intermediate gear unit 15 is shifted to a connection between the first in-coupling gearwheel 13 and the second out-coupling gear-wheel 17. Now the rotation of the out-coupling axis 14 of the electric motor 11 is passed on via the first in-coupling gearwheel 13 and the intermediate gear unit 15 to the second out-coupling gearwheel 17. Said gearwheel 17 is coupled to a first tooth belt wheel 18 the latter which is rotatably connected to the first rotation axis 7. The tooth belt 19 is connected between the first and second tooth belt wheel 18, 20 and drives the second tooth belt wheel 20, which wheel is fixedly connected to the second rotation axis 8. So, the second rotation axis 8 is being driven to rotate the second display part 3 though an angle of substantially 180 degrees. At the end of that rotation the first and second display parts 2, 3 need to be in one plane to get a good uninterrupted view of the display layer 6 for the passengers (FIG. 9).

Figure 10:
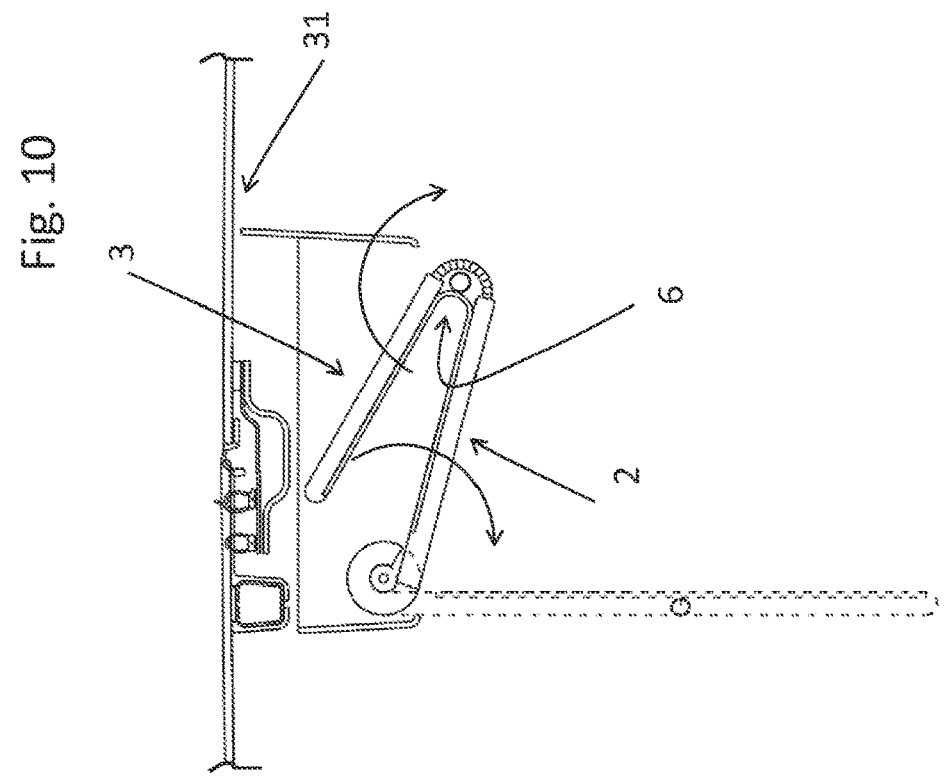
FIG. 10 is a side view corresponding to that of FIG. 7 but showing the display device in another embodiment wherein the first and second display parts unfold substantially simultaneously.

FIG. 10 shows another embodiment wherein the rotation of the first and second display parts 2, 3 and therewith the unfolding of the foldable display 1 is being carried out in a substantially simultaneous way. The first display part 2 is rotated for a certain angle, not being 90 degrees, after which simultaneously with the second display part 2, the second display part 3 starts to rotate (illustrated by the two arrows) and ends rotating in a position wherein the first and second display parts 2, 3 and therewith the display layer 6 are positioned in one plane (shown in interrupted lines).

Figures 11, 12:
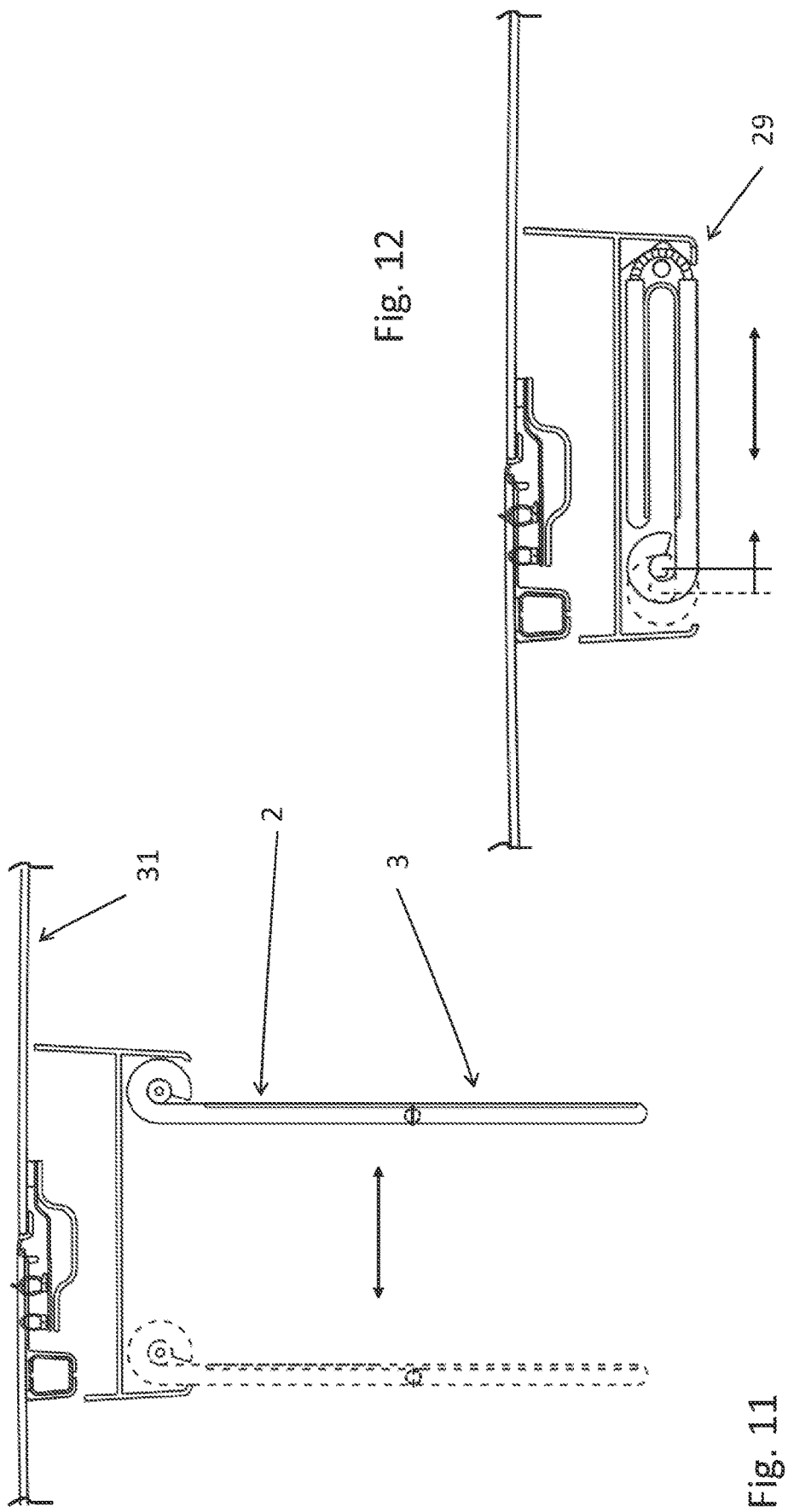
FIG. 11 is a side view corresponding to that of FIG. 7 but showing the display device in another embodiment, wherein the display device may be moved in a longitudinal direction when it is in an unfolded position.
FIG. 12 is a side view corresponding to that of FIG. 7 but showing the display device in yet another embodiment wherein the display device may be moved in a longitudinal direction when it is a folded position.

In FIG. 11 the foldable display 1 is unfolded. It may be conceivable that the foldable display 1 needs to be adjusted for the passengers in a longitudinal direction. This is pos-sible by moving the foldable display 1 altogether including the first drive system 10, 10' in a longitudinal direction in the vehicle interior (illustrated by the arrow) between the posi-tions shown by interrupted and uninterrupted lines).

The longitudinal movement, front to rear vice versa, of the foldable display 1 is driven by a second drive system 23. The working principle is best to be described using FIGS. 4 and 5. This second drive system 23 comprises a second electric motor 28, a pair of drive cables 26, 26' connected to the second electric motor 28, said drive cables being led via drive tubes 33, 33' to a pair of guides 24, 24'. In each of these guides 24, 24', a slider bracket 25, 25' is slidably engaged and each of the drive cables 26,26' is fixedly connected to the respective slider brackets 25, 25'. Each of the slider brackets 25, 25' has two protruding parts with holes with which these brackets 25, 25' are connected to each of the upper axis brackets 21, 21' by means of screws (not shown). Upon a rotational movement produced by the second electric motor 28, the drive cables 26, 26' are being moved in the drive tubes 33, 33' and in the guides 24, 24' in a rectilinear way. This movement is transferred to the slider brackets 25, 25' and thus to the upper axis brackets 21, 21'. Because of the complete first drive system 10 including the first and second display parts 2, 3 being connected to the upper axis brackets 21, 21' the whole of the foldable display 1 may be moved in a longitudinal direction.

Likewise, it is conceivable that forementioned second drive system 23 is being used to move the complete foldable display unit 1 in a longitudinal direction, such that the folded display parts 2, 3 slide over a support 29 such as shown in FIG. 12. The sliding distance is illustrated by the interrupted and uninterrupted lines.

Figure 13:
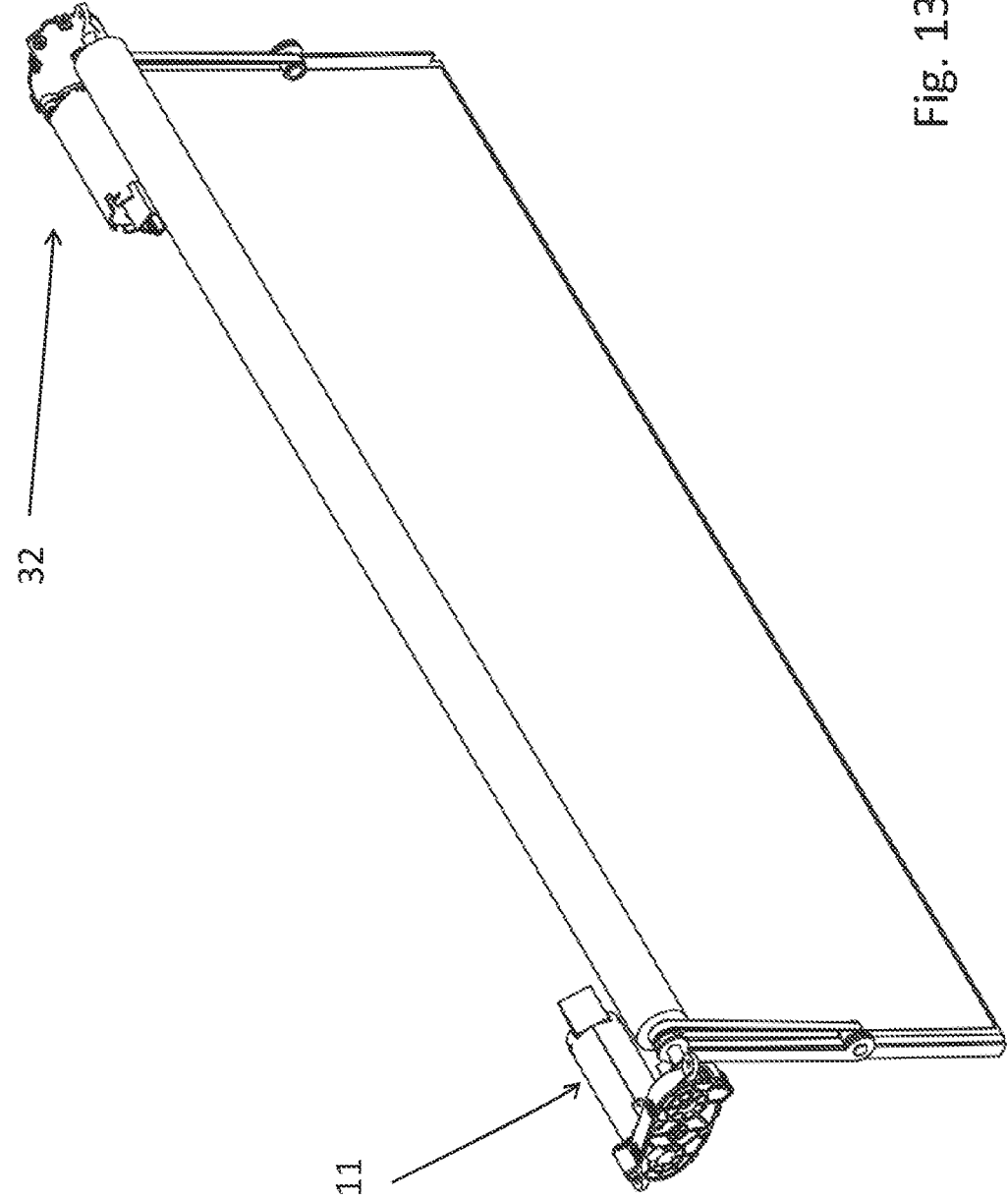
FIG. 13 is an isometric view of a part of the display device showing another embodiment having two electric motors on either side of the device.
Figure 14:
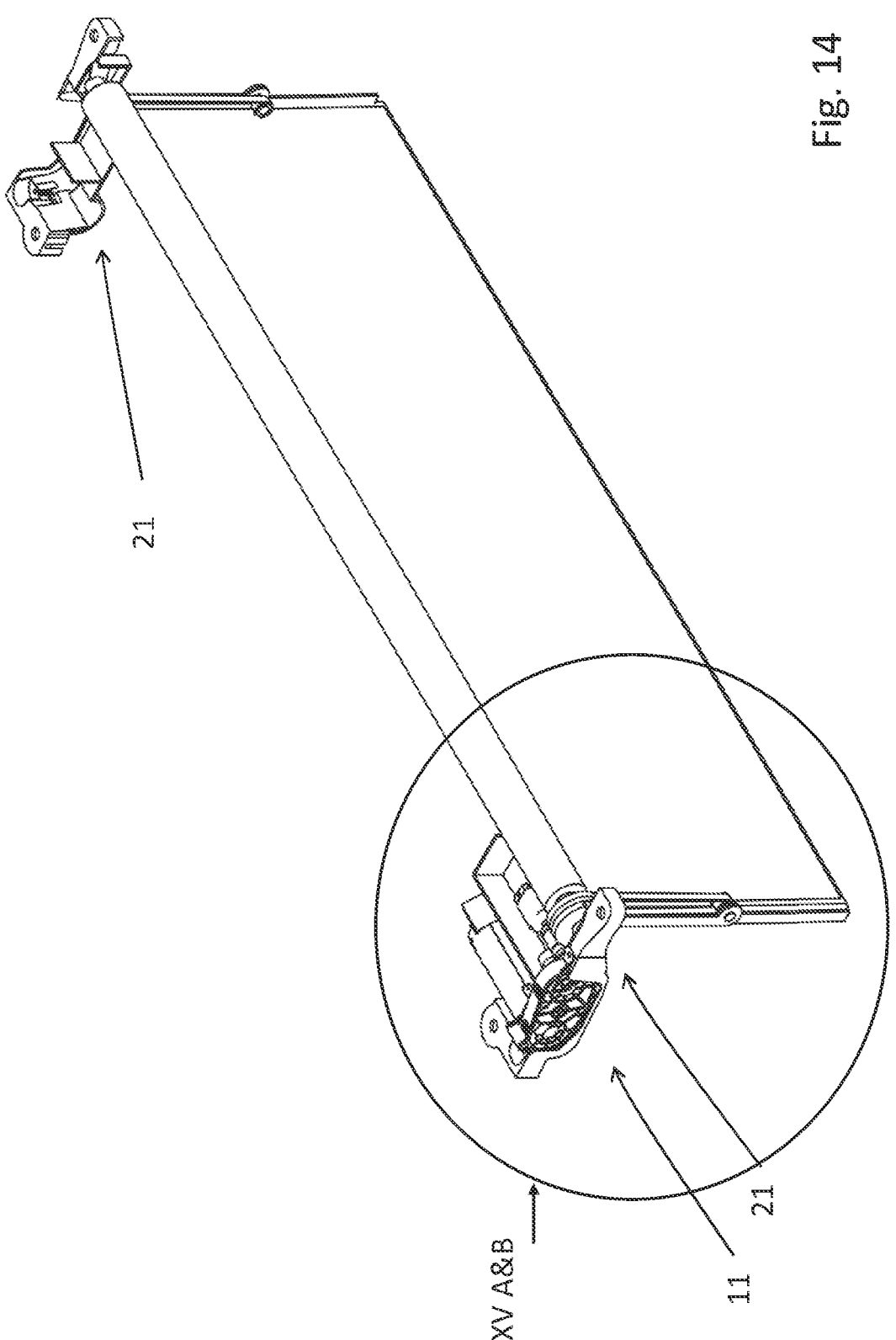
FIG. 14 is an iso metric view showing part of the display device in an unfolded position.

FIG. 13 discloses another embodiment in which the power for folding the first and second display parts 2, 3 is given by a first electric motor 11 and a third electric motor 32. The additional third electric motor 32 may be required when the display parts 2, 3 are too heavy for the first electric motor 11 alone to maneuver. Obviously the third electric motor 32 is also equipped with a first drive system 10', which is an assembly of mirror imaged parts of the first drive system 10.

Figures 15A, 15B:
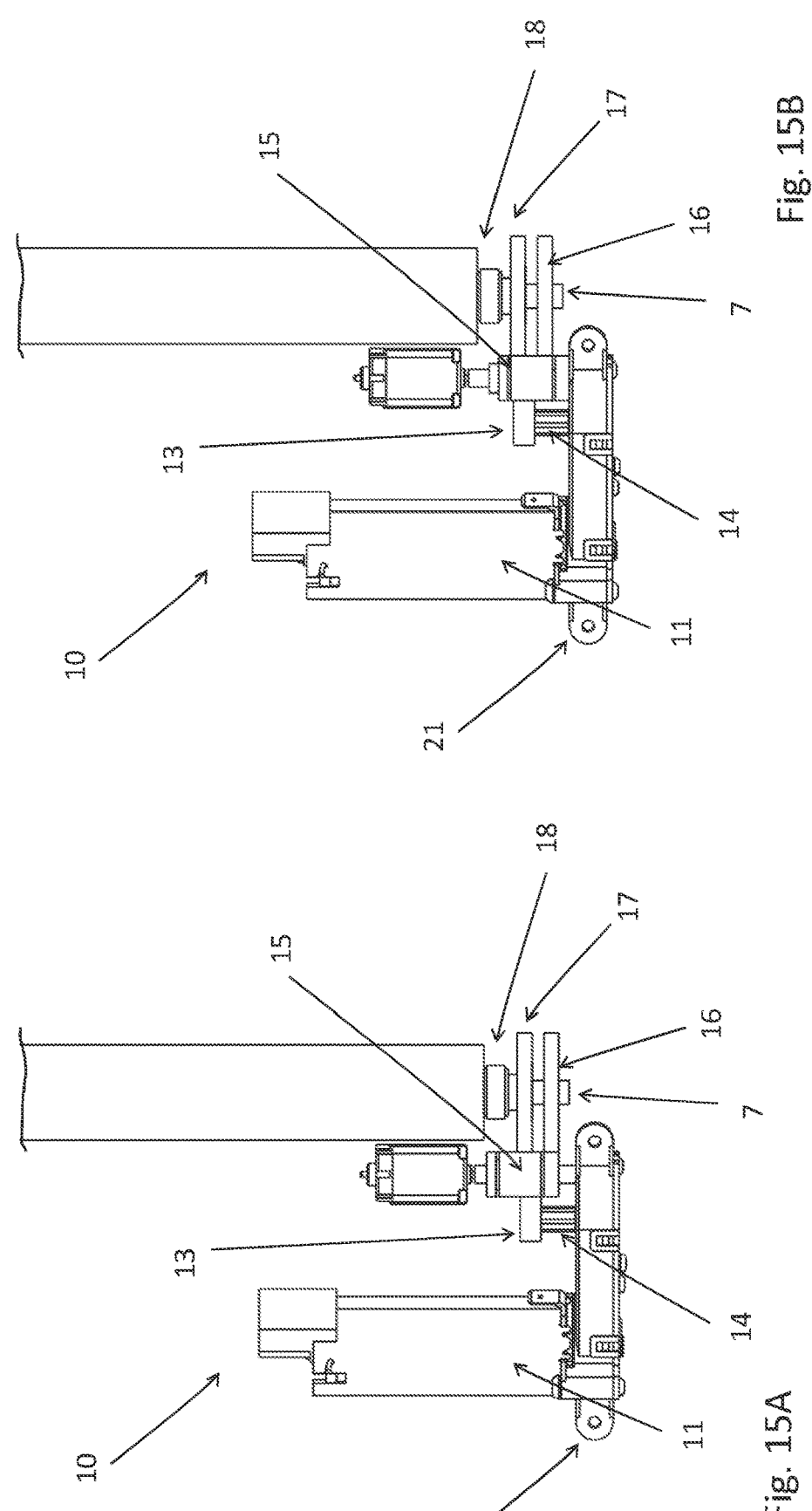
FIG. 15A is a plan view of the first drive system (of the part XV in FIG. 14) in a first gear position.
FIG. 15B is a plan view of the first drive system (of the part XV in FIG. 14) in a second gear position.

In FIG. 15A and FIG. 15B in a plan view the first drive system 10 is shown in detail, whereby the intermediate gear unit 15 is shown. This gear unit 15 is capable of connecting the first in-coupling gearwheel 13 to the first out-coupling gear wheel 16 or the second out-coupling gearwheel 17 respectively or to both of the first and second out-coupling gearwheels 16, 17 simultaneously.

Generally, the foldable display parts 2, 3 will be covered, as in being protected in the storage position, that is the image displaying parts and therewith the portions of the flexible display layer 6 are turned inwardly and thereby facing each other.

The flexible display layer 6 is directed towards the rear passengers, but it is also conceivable that the flexible display layer 6 is directed to the front passengers if the front seats are rotatable, such as in a mobile home or autonomous vehicle.

Although the present invention has been described with reference to preferred embodiments, workers skilled in the art will recognize that changes may be made in form and detail without departing from the spirit and scope of the invention.

What is claimed is:

1. A display device for attachment to a roof construction of a vehicle, comprising:
   at least one foldable display capable of showing images to occupants in the vehicle, the foldable display having a first and a second display part;
   a first drive system mounted to the roof construction configured to move the foldable display at least into a substantial horizontal orientated stored position, in which the foldable display is folded, and into an operational position in which the foldable display is in an unfolded position such that an image producing side of the foldable display is visible for occupants in an interior space of the vehicle and whereby the first and second display parts, in their operational position, are positioned such that the first display part is above the second display part, seen in a vertical direction, and such that a flexible display layer connects the first and second display parts, said flexible display layer being capable of showing a part of an image and connecting the first and second display parts in such a way that a visually uninterrupted image across the whole image producing side of the foldable display is observed by the occupants,
   wherein the first drive system comprises at least one electric motor, and a gear device driven by the at least one electric motor and capable of rotatably driving the first display part and rotatably driving the second display part.

2. The display device according to claim 1, wherein the roof construction is either of a part of a roof of an integral body of the vehicle or the roof construction has at least one semi-transparent panel.

3. The display device according to claim 1, wherein the gear device is capable of rotatably driving the first display part and the second display part in sequential movements, whereby in a first rotation the first and second display parts are rotatably driven together through an angle of substantially 90 degrees and subsequently in a second rotation and wherein the second display part is being rotated through an angle of substantially 180 degrees.

4. The display device according to claim 1, wherein the gear device is capable of rotatably driving the first display part and the second display part at least partly at the same time.

5. The display device according to claim 1, wherein the foldable display is further reinforced with pairs of first and second reinforcement brackets attached to respectively both lateral edges of the first and second display parts.

6. The display device according to claim 5, wherein a first rotation axis is rotatably connected via a rotation shaft to the first display part and wherein the first rotation axis is fixedly connected to the first reinforcement brackets and wherein a second axis is connected to the second display part by the second reinforcement brackets.

7. The display device according to claim 6, wherein the first rotation axis is rotatably connected at opposite ends to the roof construction by a pair of upper axis brackets.

8. The display device according to claim 6, wherein the gear device comprises at least a first in-coupling gearwheel connected to an out-coupling axis of the at least one electric motor and an intermediate gear unit selectively coupled between the first in-coupling gearwheel and a first out-coupling gearwheel connected to the first rotation axis and a second out-coupling gearwheel connected to a tooth belt wheel, the latter which is capable of rotating freely around the first rotation axis.

9. The display device according to claim 8, wherein the gear device further comprises a tooth belt being driven by the tooth belt wheel and the tooth belt being connected, opposite to the tooth belt wheel, to a second outcoupling tooth belt wheel, the latter being fixedly connected to the second rotation axis.

10. The display device according to claim 9, wherein a second drive system is connected to the foldable display configured to move the display device in a substantially horizontally oriented longitudinal direction.

11. The display device according to claim 10, wherein the second drive system comprises a pair of guides connected to the roof construction of the vehicle in a longitudinal direction, a pair of slider brackets connected to the foldable display, each of the slider brackets being slidably connected in each of the guides, a pair of drive cables slidably guided in each of a channel in the respective guides, whereby the drive cables are connected to each of the slider brackets and the drive cables are driven by a second electric motor and wherein each of the slider brackets are capable of being moved in longitudinal direction along the guide.

12. The display device according to claim 1, wherein the foldable display is capable of being moved in its storage position, whereby the foldable display in the stored position is supported by at least one support.

13. A vehicle comprising:
a roof;
a display device attached to the roof, the display device comprising:
    at least one foldable display capable of showing images to occupants in the vehicle, the foldable display having a first and a second display part;

a first drive system mounted to the roof configured to move the foldable display at least into a substantial horizontal orientated stored position, in which the foldable display is folded, and into an operational position in which the foldable display is in an unfolded position such that an image producing side of the foldable display is visible for occupants in an interior space of the vehicle and whereby the first and second display parts, in their operational position, are positioned such that the first display part is above the second display part, seen in a vertical direction, and such that a flexible display layer connects the first and second display parts, said flexible display layer being capable of showing a part of an image and connecting the first and second display parts in such a way that a visually uninterrupted image across the whole image producing side of the foldable display is observed by the occupants, wherein the first drive system comprises at least one electric motor, and a gear device driven by the at least one electric motor and capable of rotatably driving the first display part and rotatably driving the second display part.

14. The vehicle according to claim 13, wherein the gear device is capable of rotatably driving the first display part and the second display part in sequential movements, whereby in a first rotation the first and second display parts are rotatably driven together through an angle of substantially 90 degrees and subsequently in a second rotation and wherein the second display part is being rotated through an angle of substantially 180 degrees.

15. The vehicle according to claim 13, wherein the gear device is capable of rotatably driving the first display part and the second display part at least partly at the same time.

16. The vehicle according to claim 13, wherein the foldable display is further reinforced with pairs of first and second reinforcement brackets attached to respectively both lateral edges of the first and second display parts.

17. The vehicle according to claim 16, wherein a first rotation axis is rotatably connected via a rotation shaft to the first display part and wherein the first rotation axis is fixedly connected to the first reinforcement brackets and wherein a second axis is connected to the second display part by the second reinforcement brackets.

18. The vehicle according to claim 17, wherein the first rotation axis is rotatably connected at opposite ends to the roof construction by a pair of upper axis brackets.

19. The vehicle according to claim 17, wherein the gear device comprises at least a first in-coupling gearwheel connected to an out-coupling axis of the at least one electric motor and an intermediate gear unit selectively coupled between the first in-coupling gearwheel and a first out-coupling gearwheel connected to the first rotation axis and a second out-coupling gearwheel connected to a tooth belt wheel, the latter which is capable of rotating freely around the first rotation axis.

20. The vehicle according to claim 19, wherein the gear device further comprises a tooth belt being driven by the tooth belt wheel and the tooth belt being connected, opposite to the tooth belt wheel, to a second outcoupling tooth belt wheel, the latter being fixedly connected to the second rotation axis.

* * * * *